United States Patent
Marshall et al.

(10) Patent No.: US 6,825,699 B2
(45) Date of Patent: Nov. 30, 2004

(54) CHARGE PUMP CIRCUIT, PASSIVE BUFFER THAT EMPLOYS THE CHARGE PUMP CIRCUIT, AND PASS GATE THAT EMPLOYS THE CHARGE PUMP CIRCUIT

(75) Inventors: David John Marshall, Fort Collins, CO (US); Ian Erickson, Fort Collins, CO (US); Michael H. Cogdill, Longmont, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/355,437

(22) Filed: Jan. 31, 2003

(65) Prior Publication Data
US 2004/0150009 A1 Aug. 5, 2004

(51) Int. Cl.[7] .............................. H03B 1/10; H03K 3/00
(52) U.S. Cl. ...................... 327/108; 327/390; 327/536
(58) Field of Search ................................ 327/108, 112, 327/390, 536, 538, 544, 427, 434; 326/82, 83, 88, 113

(56) References Cited

U.S. PATENT DOCUMENTS

| | | | | |
|---|---|---|---|---|
| 4,401,904 A | * | 8/1983 | White et al. ................ 327/288 |
| 4,408,136 A | * | 10/1983 | Kirsch ......................... 326/70 |
| 4,521,701 A | * | 6/1985 | Reddy ......................... 327/281 |
| 5,694,061 A | * | 12/1997 | Morosawa et al. ......... 326/119 |
| 5,917,348 A | | 6/1999 | Chow .......................... 327/108 |
| 6,271,685 B1 | * | 8/2001 | Nagasawa et al. .......... 326/113 |

FOREIGN PATENT DOCUMENTS

| | | |
|---|---|---|
| EP | 0379169 B1 | 1/1990 |
| EP | 0379169 A2 | 1/1990 |
| GB | 2175162 A | 4/1986 |

OTHER PUBLICATIONS

Search Report under Section 17, Jun. 2, 2004, 1 page.

* cited by examiner

*Primary Examiner*—Quan Tra

(57) ABSTRACT

Buffer that includes an input node, an output node, and a three-transistor charge pump circuit is coupled to the input node and the output node. The buffer generates an output signal that is a delayed version of a signal presented at the input node. The three-transistor charge pump includes a first transistor (e.g., a pass transistor) that includes a drain electrode that is coupled to the input node, a gate electrode and a source electrode; a second transistor that includes a drain electrode that is coupled to a first predetermined voltage, a gate electrode coupled to the drain electrode of the second transistor, and a source electrode coupled to the gate electrode of the first transistor; and a capacitive element that includes a first electrode that is coupled to the source electrode of the second transistor and the gate electrode of the first transistor and a second electrode that is coupled to the output node.

9 Claims, 9 Drawing Sheets

US 6,825,699 B2

CHARGE PUMP CIRCUIT, PASSIVE BUFFER THAT EMPLOYS THE CHARGE PUMP CIRCUIT, AND PASS GATE THAT EMPLOYS THE CHARGE PUMP CIRCUIT

FIELD OF THE INVENTION

The present invention relates generally to passive buffers and pass gates, and more particularly, to a charge pump circuit, passive buffer that employs the charge pump circuit, and pass gate that employs the charge pump circuit.

BACKGROUND OF THE INVENTION

Pass Gates

A pass gate is an important circuit element for use in design of digital circuits. There are many applications that utilize pass gates. These applications include, but are not limited to, multiplexers, combinatorial gates, and latches. The pass gate is useful for a designer to selectively allow an input signal to pass or propagate to the output of the pass gate.

FIG. 9 illustrates a prior art full pass gate implemented with an n-type FET and a p-type FET. The full pass gate passes signals when node A is a low logic level and node B is a high logic level. It is noted that two signals (an original and a complement) are needed to control the operation of the full pass gate.

These prior art pass gates have several disadvantages. First, in certain situations, it may not be convenient to generate a complement of an original signal. Second, in many situations, it is desirable for the pass gate to generate an output signal that has a full logic level. When both these situations exist, these prior art pass gates may not be utilized to meet this dual-prong requirement.

Moreover, there are some instances during the design of integrated circuits where it may be desirable for the pass gate to be implemented with a single type of FET in order to simplify or reduce the layout of the circuit or otherwise to meet a space or layout constraint. Unfortunately, the prior art full pass gate requires at least one N-FET and at least one P-FET to operate.

There also exist n-type FET only pass gates and p-type FET only pass gates. The advantage to these types of pass gates is that no complement control signal needs to be generated. The disadvantage is that the n-type FET only pass gates only pass a logic 0 well (e.g., a logic 1 is not fully passed electrically). Similarly, p-type FET only pass gates only pass a logic 1 well (e.g., a logic 0 is not fully passed electrically).

Passive Buffers

A passive buffer (also known as a delay) is an important circuit element for use in design of digital circuits. There are many applications that utilize delays. These applications include, but are not limited to, deracing devices and skew reduction devices. The delay is useful for a designer to create a complement signal based on an original signal.

The complement signal is typically an inverted signal that has a logic level opposite of the original signal. There are two desirable characteristics of the resulting complement signal. First, it is desirable for the complement signal to have the same logic levels as the original signal because typically the application of a signal and its complement are equal in value but opposite in polarity. A full logic level for a signal and its complement is useful in traditional full pass gate structures.

Second, it is desirable for the complement signal to have a minimal amount of skew with respect to the original signal. Skew is defined at a given point (e.g., threshold point) on the signals' transition (or edge) as the time differences between that given point on two different signals.

FIG. 10 illustrates a prior art inverted delay implemented with an n-type FET and a p-type FET. This prior art passive buffer tends to suffer from the following disadvantage. The inverted delay does not generate a complement signal with a full logic level. Because n-type FET does not pass logic 1 well and p-type FET does not pass logic 0 well, the complement signal has logic levels that are less than the levels of the original signal.

Furthermore, there are some instances during the design of integrated circuits where it may be desirable for the passive buffers to be implemented with a single type of FET in order to simplify or reduce the layout of the circuit or otherwise to meet a space or layout constraint. Unfortunately, the prior art passive buffers do not offer full logic level with a single type of FET.

Based on the foregoing, there remains a need for passive buffers and pass gates that overcome the disadvantages of the prior art as set forth previously.

SUMMARY OF THE INVENTION

According to one embodiment of the present invention, a buffer that includes an input node, an output node, and a three-transistor charge pump circuit that is coupled to the input node and the output node is described. The buffer generates an output signal that is a delayed version of a signal presented at the input node. The three-transistor charge pump includes a first transistor that includes a drain electrode that is coupled to the input node, a gate electrode and a source electrode; a second transistor that includes a drain electrode that is coupled to a first predetermined voltage, a gate electrode coupled to the drain electrode of the second transistor, and a source electrode coupled to the gate electrode of the first transistor; and a capacitive element that includes a first electrode that is coupled to the source electrode of the second transistor and the gate electrode of the first transistor and a second electrode that is coupled to the output node.

According to another embodiment of the present invention, a pass gate that includes an input node, an output node, and a charge pump circuit that is coupled to the input node and the output node is described. The charge pump circuit has a fourth transistor (referred to as a control transistor). The control transistor receives a control signal and based thereon selectively enables the first transistor (e.g., the pass transistor) to pass the signal at the input node to the output node. When the control transistor is off, the charge pump circuit behaves as in the passive buffer embodiment, thereby allowing the input to pass to the output at a full logic level. When the control transistor is off, the control transistor drains the charge pump node, thereby disabling the first transistor (e.g., the pass transistor).

Other features and advantages of the present invention will be apparent from the detailed description that follows.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Figure 1:
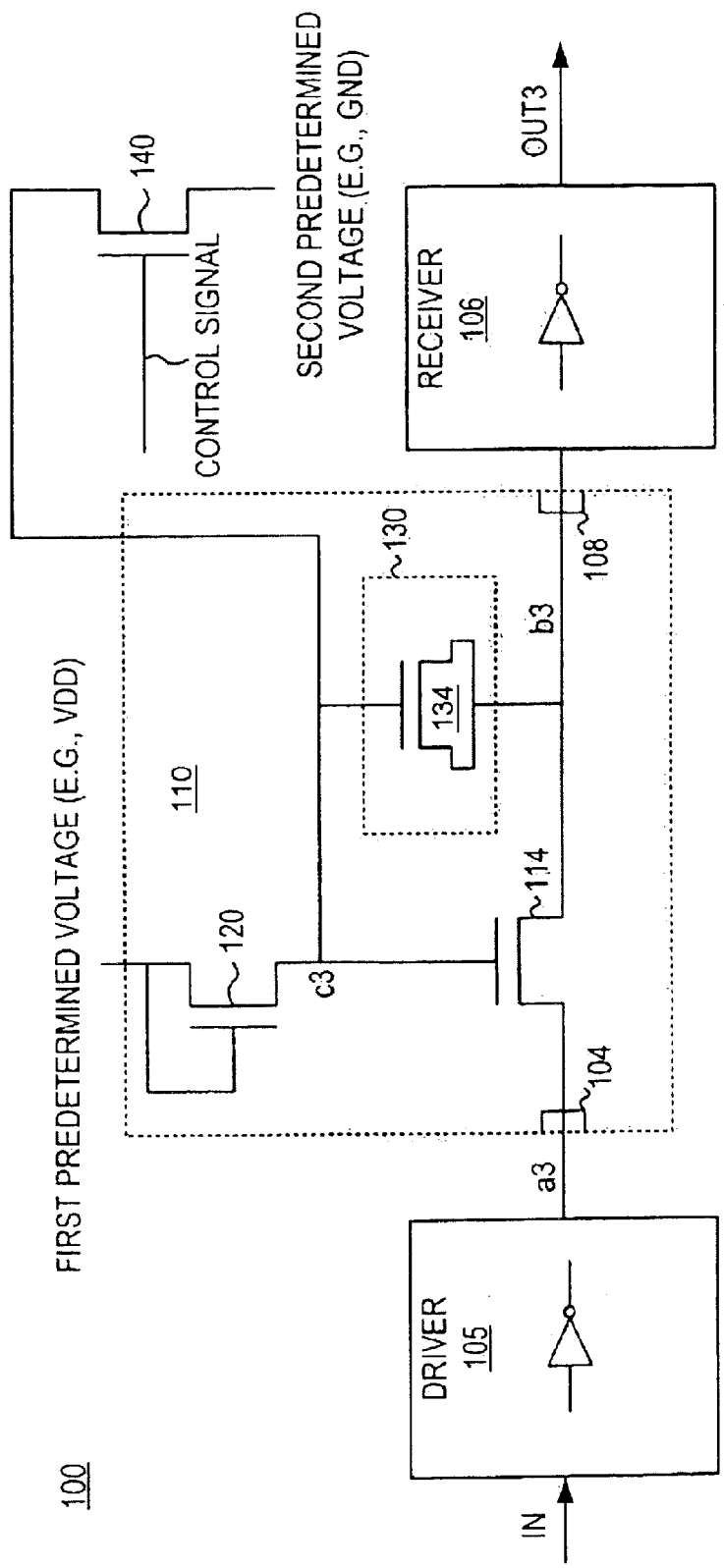
FIG. 1 illustrates a full logic level pass gate implemented only with n-type FETs according to one embodiment of the present invention can be implemented.

The various signals described herein are generally "on" (i.e., a logic high level or 1) or "off" (i.e., a logic low level or 0). However, the particular polarities of the "on" (e.g., asserted) and "off" (e.g., de-asserted) states of the signals may be adjusted (e.g., reversed) accordingly to meet the design criteria of a particular implementation. Furthermore, it is to be appreciated by those of ordinary skill in the art that NMOS FETs can be implemented with an equivalent circuit of PMOS FETs. Similarly, PMOS FETs can be implemented with an equivalent circuit of NMOS FETs Full Logic Level Pass Gate FIG. 1 illustrates a full logic level pass gate 100 implemented only with n-type FETs according to one embodiment of the present invention can be implemented. The full logic level pass gate 100 includes an input node 104 and an output node 108. The input node 104 can be coupled to the output of a gate (e.g., an inverter as shown). The output node 108 can be coupled to the input of a gate (e.g., an inverter as shown). The pass gate 100 is shown in context of a driver circuit 105 and a receiver circuit 106

The full logic level pass gate 100 includes a charge pump 110. When the charge pump 110 is implemented with a single type of FETs, the charge pump 110 is referred to as a "homogenous transistor type transistor charge pump" 110 or a "homogenous bootstrap circuit" 110. The homogenous charge pump 110 includes a first transistor 114, a second transistor 120, and a capacitor 130 (which as described in greater detail hereinafter can be implemented with a third transistor 134). The full logic level pass gate 100 also includes a control transistor 140 that is coupled to the homogenous charge pump 110.

According to one embodiment of the invention, the pass gate is implemented with a single type of FET transistors (e.g., by all n-type FETs or all p-type FETs). This implementation is referred to as a homogenous implementation. It is noted that the pass gate in this implementation passes full logic levels.

The homogenous bootstrap circuit operates by creating an isolated node that is held at a static voltage. This node (e.g., node b3) is then connected to the output 108 by means of a capacitance (e.g., capacitive element 130). The capacitive element 130 allows for feedback, which is also commonly known as bootstrapping. This feedback is in the form of voltage changes at the isolated node (e.g., node b3) that tracks or follows the voltage changes at the output 108. The operation of this structure is described in greater detail with reference to FIG. 2.

The first transistor 114 includes a drain electrode that is coupled to the input node 104, a gate electrode, and a source electrode. The second transistor 120 includes a drain electrode that is coupled to a predetermined voltage (e.g., $V_{DD}$), a gate electrode coupled to the drain electrode, and a source electrode coupled to the gate electrode of the first transistor 114. In this example, the predetermined voltage (e.g., $V_{DD}$) is approximately 1.08V, and the ground potential is approximately 0V.

The capacitor 130 includes a first electrode that is coupled to the source electrode of the second transistor 120 and the gate electrode of the first transistor 114. The capacitor 130 also includes a second electrode that is coupled to the output node 108.

The capacitor 130 has a capacitance in the picoFarad range and can be implemented, for example, by using 1) a FET with a gate electrode as a first terminal and the source electrode shorted to the drain electrode as the second terminal, and 2) an active area capacitor. In one embodiment, the capacitor 130 is implemented with an n-type transistor 134 (e.g., an n-type field effect transistor n-FET)). The n-type transistor 134 includes a drain electrode and a source electrode both coupled to the output node 108. The n-type transistor 134 also includes a gate electrode coupled to the gate electrode of the first transistor 114 and the source electrode of the second transistor 120.

The control transistor 140 includes a drain electrode that is coupled to the gate electrode of the first transistor 114, a gate electrode coupled to receive a control signal (CNTL) and a source electrode that is coupled to a second predetermined voltage (e.g., a ground voltage (GND)).

Figure 2:
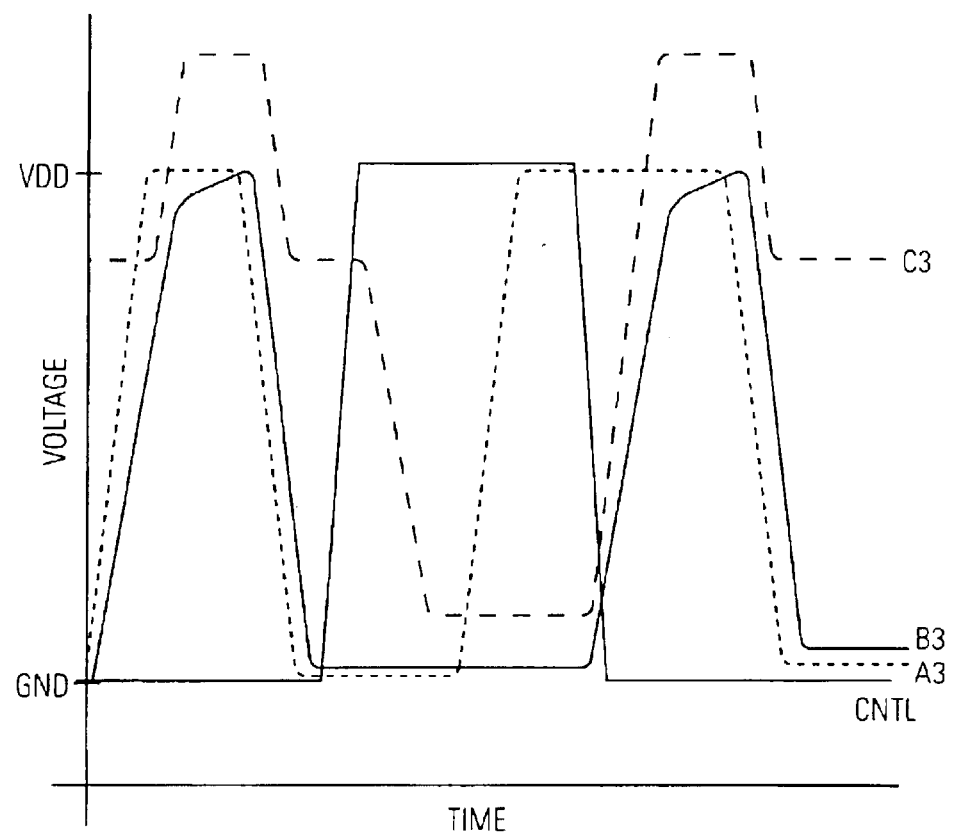
FIG. 2 illustrates the operation of the full logic level pass gate of FIG. 1.

FIG. 2 illustrates the operation of the full logic level pass gate 100 of FIG. 1. The nodes of interest are node a3 (input node), node b3 (output node), node c3 (internal node), and node cntl. The wave forms for node a3, node b3, node c3, and node cntl are denoted with the labels "a3", "b3", "c3", and "cntl", respectively. Referring to FIG. 2, it is noted that when the control signal is asserted (i.e., the cntl node is at a logic high level), the voltage at the c3 node is approximately at a ground potential since the control transistor 140 is on and couples the c3 node to GND.

When the control signal transitions from a logic high level to a logic low level, thereby turning the control transistor 140 off, the voltage at the c3 node rises to approximately one threshold voltage drop below $V_{DD}$.

The node "CNTL" dictates whether or not the pass gate is on or off. When node "CNTL" is equal to GND, the pass gate is on, and the charge pumping mechanism operates as follows. During normal operation node, node "c3" is held at a high voltage by the transistor connected to $V_{DD}$. This causes the input transistor 114 to pass the voltage value of node "a3" to node "b3".

When node "a3" is a logical zero, the n-FET immediately passes this value, and node "b3" becomes zero. But, if node "a3" is a logical one, "b3" charges, but does not immediately become a full logical one. Node "b3" is connected to node "c3" via a capacitor, so when node "b3" rises in voltage, node 'voltage because the voltage across a capacitor cannot change instantaneously. Boosting the voltage at node "c3" causes n-FET 114 to open enough to pass a full logical one from node "a3" to node "b3". In general, a voltage change at the input (i.e., node a3) causes the voltage at the output (i.e., node b3) to change or move. The movement or change in voltage at node b3 causes an equal movement in the voltage at node c3 (internal node) since the voltage across a capacitor cannot change instantaneously. As the voltage at node c3 changes (e.g., is boosted), n-FET 114 is turned on more to allow more current flow therethrough.

When node "CNTL" is equal to $V_{DD}$, the pass gate is off. The n-FET node "CNTL" is driving is turned on and discharges node "c3". The control transistor 140 and the second transistor 120, which is connected to $V_{DD}$, act as an n-FET only inverter. The operation of the inverter can be improved by utilizing an enhanced (e.g., low $V_t$) n-FET. As node "c3" is discharged, the first transistor 114 that is connected to nodes "a3" and "b3" is shut off. Thus, the value at "a3" cannot propagate to "b3".

It is noted that the homogenous charge pump circuit 110 (also referred to herein as a homogenous "bootstrap circuit") may be implemented with all p-type FETs. One advantage of implementing the three-transistor charge pump circuit with a single type of FET (e.g., all n-type FETs or all p-type FETs) is that for certain cases, the layout corresponding to the pass gate may be optimized.

To create a gate of complementary MOSFETs one needs to define a well region and a region outside of the well to place transistors. This CMOS implementation may be troublesome in cases where a designer is editing an existing design, and the correct space/spacing for CMOS cannot be created. Thus, it can be advantageous to create a single MOSFET pass gate that is completely encapsulated in a well or outside a well.

It is noted that the charge pump circuit 110 can include a combination of n-type and p-type FETs in other embodiments of the invention.

It is noted that the pass gate can be implemented with an n-FET-only design or a p-FET-only design. In an n-FET-only design, a logic high signal (e.g., a logic one) opens the pass gate, and a logic low signal (e.g., a logic zero) closes the pass gate. In a p-FET-only design, a logic high signal (e.g., a logic one) closes the pass gate, and a logic low signal (e.g., a logic zero) opens the pass gate.

Full Logic Level Passive Buffer Implemented with n-FETs

Figure 3:
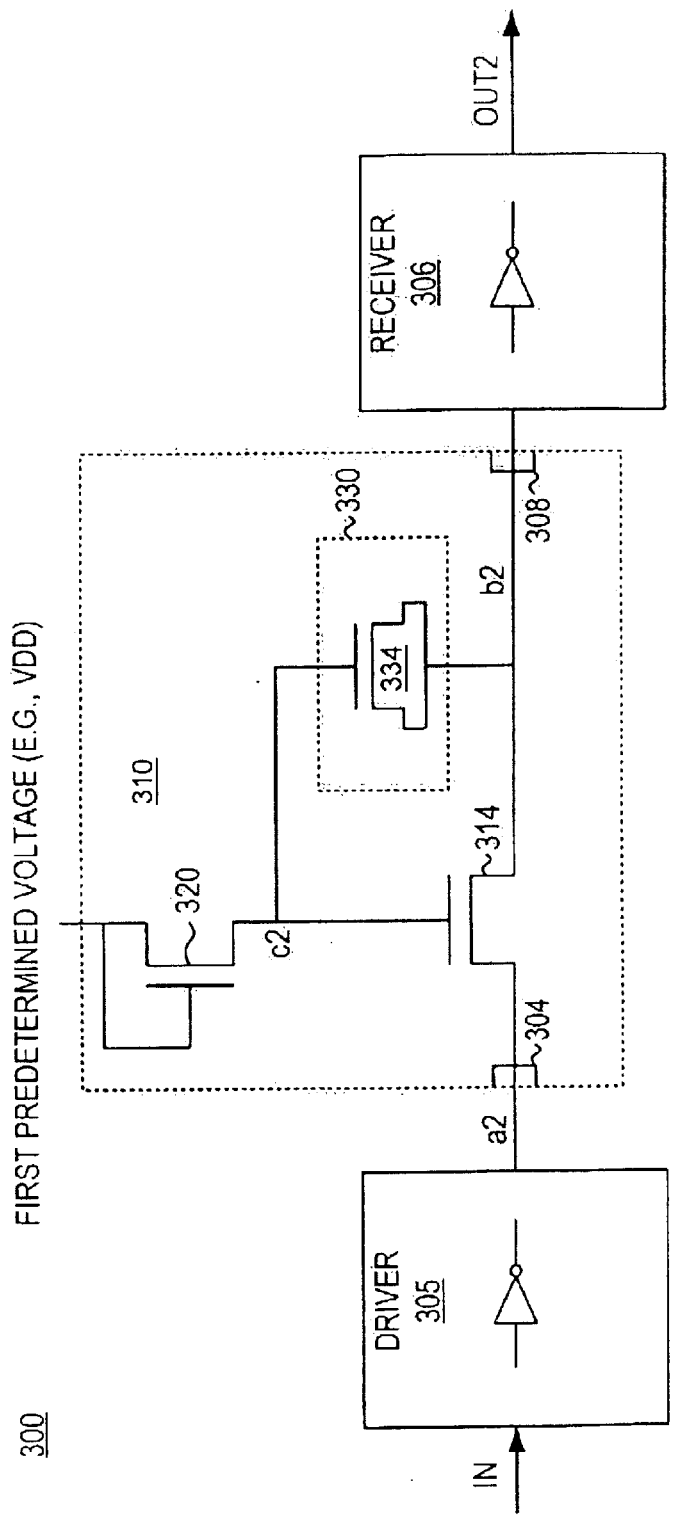
FIG. 3 illustrates a full logic level passive buffer implemented only with n-type FETs according to one embodiment of the present invention can be implemented.

FIG. 3 illustrates a full logic level passive buffer 300 implemented only with n-type FETs according to one embodiment of the present invention can be implemented. The passive buffer 300 includes an input node 304 and an output node 308. The input node 304 can be coupled to the output of a gate (e.g., an inverter as shown). The output node 308 can be coupled to the input of a gate (e.g., an inverter as shown). The passive buffer 300 is shown in context of a driver circuit 305 and a receiver circuit 306

The passive buffer 300 includes a homogenous transistor type transistor charge pump 310 (also referred to herein as a homogenous "bootstrap circuit" 310). The homogenous charge pump 310 includes a first transistor 314, a second transistor 320, and a capacitor 330 (which as described in greater detail hereinafter can be implemented with a third transistor).

The first transistor 314 includes a drain electrode that is coupled to the input node 304, a gate electrode, and a source electrode. The second transistor 320 includes a drain electrode that is coupled to a predetermined voltage (e.g., $V_{DD}$), a gate electrode coupled to the drain electrode, and a source electrode coupled to the gate electrode of the first transistor 314. In this example, the predetermined voltage (e.g., $V_{DD}$) is approximately 1.08V.

The capacitor 330 includes a first electrode that is coupled to the source electrode of the second transistor 320 and the gate electrode of the first transistor 314. The capacitor 330 also includes a second electrode that is coupled to the output node 308.

The capacitor 330 has a capacitance in the picoFarad range and can be implemented, for example, by using a 1) FET with a gate electrode as a first terminal and the source electrode shorted to the drain electrode as the second terminal, and 2) an active area capacitor.

In one embodiment, the capacitor 330 is implemented with an n-type transistor (e.g., an n-type field effect transistor (n-FET). The n-type transistor 334 includes a drain electrode and a source electrode both coupled to the output node 308. The n-type transistor 334 also includes a gate electrode coupled to the gate electrode of the first transistor 314 and the source electrode of the second transistor 320.

Figure 4:
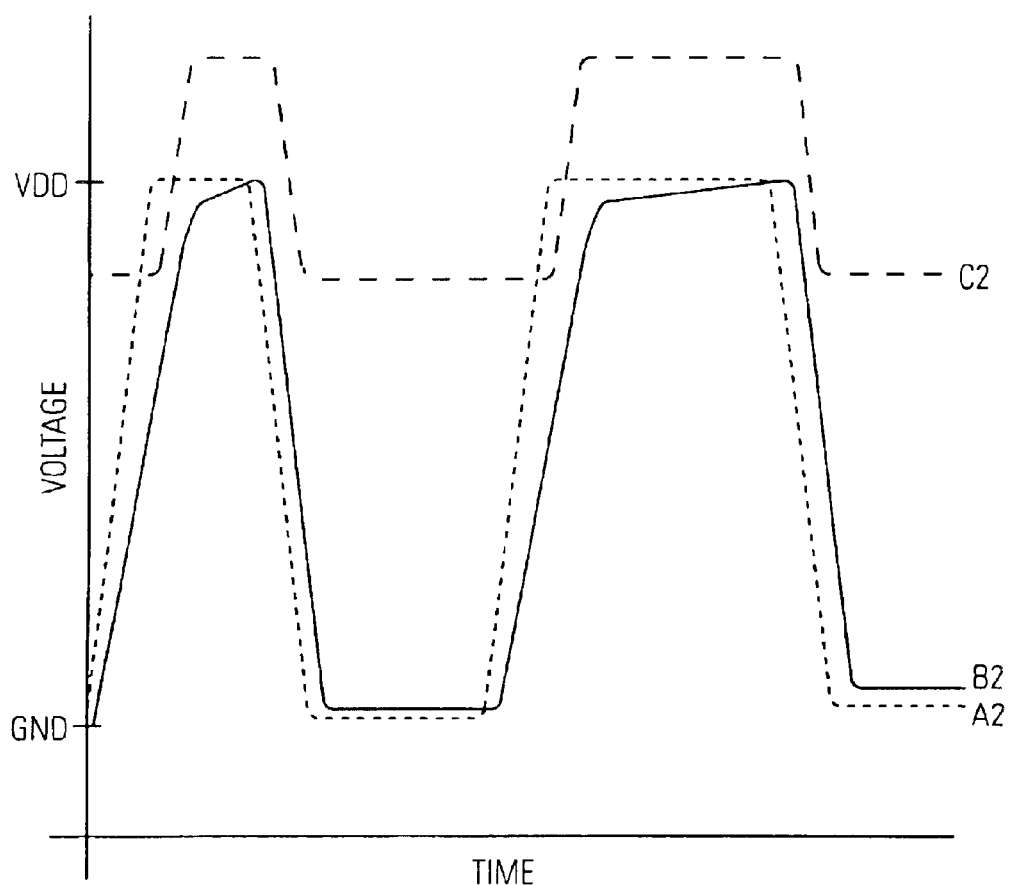
FIG. 4 illustrates the operation of the full logic level passive buffer of FIG. 3.

FIG. 4 illustrates the operation of the full logic level passive buffer 300 of FIG. 3. The nodes of interest are node a2 (input node), node b2 (output node), and node c2 (internal node). The wave forms for node a2, node b2, and node c2 are denoted with the labels "a2", "b2", and "c2", respectively.

Referring to FIG. 4, node "c2" is held at a high voltage by the transistor 120 connected to $V_{DD}$. For example, the voltage at the c2 node is at approximately one threshold voltage drop below $V_{DD}$. The high voltage at the c2 node causes the input transistor 314 to pass the voltage value of node "a2" to node "b2".

When node "a2" is a logical zero, the N-FET immediately passes this value, and node "b2" becomes zero. But, if node "a2" is a logical one, "b2" charges, but does not immediately become a full logical one. Node "b2" is connected to node "c2" via a capacitor 330, so when node "b2" rises in voltage, node "c2" also rises in voltage because the voltage across a capacitor cannot change instantaneously. Boosting the voltage at node "c2" causes n-FET 314 to open enough to pass a full logical one from node "a2" to node "b2".

Full Logic Level Passive Buffer Implemented with p-FETs

Figure 5:
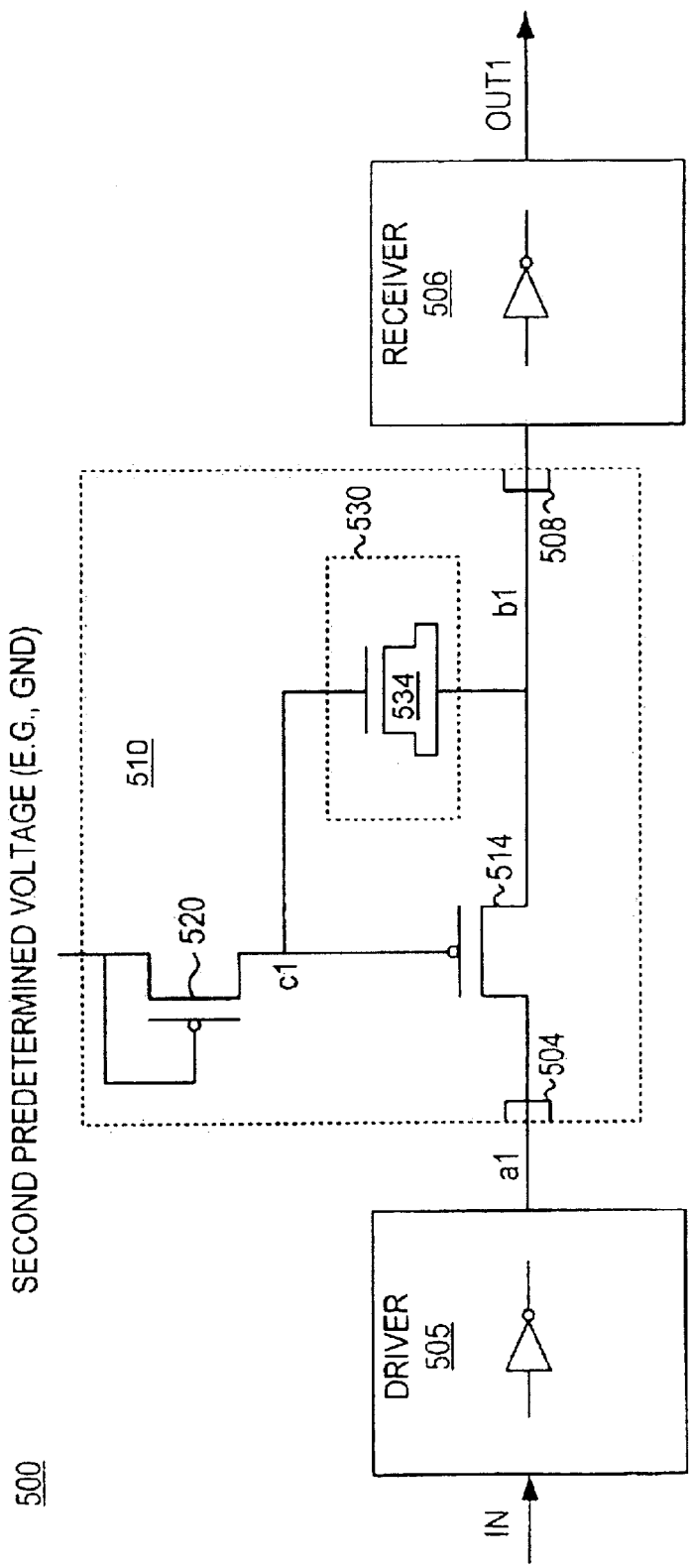
FIG. 5 illustrates a full logic level passive buffer implemented only with p-type FETs according to one embodiment of the present invention can be implemented.

FIG. 5 illustrates a full logic level passive buffer 500 implemented only with p-type FETs according to one embodiment of the present invention can be implemented. The passive buffer 500 includes an input node 504 and an output node 508. The input node 504 can be coupled to the output of a gate (e.g., an inverter as shown). The output node 508 can be coupled to the input of a gate (e.g., an inverter as shown). The passive buffer 500 is shown in context of a driver circuit 505 and a receiver circuit 506.

The passive buffer 500 includes a homogenous transistor type transistor charge pump 510 (also referred to herein as a homogenous "bootstrap circuit" 510). The homogenous charge pump 510 includes a first transistor 514, a second transistor 520, and a capacitor 530 (which as described in greater detail hereinafter can be implemented with a third transistor).

The first transistor 514 includes a drain electrode that is coupled to the input node 504, a gate electrode, and a source electrode. The second transistor 520 includes a source electrode that is coupled to a predetermined voltage (e.g., $V_{GND}$), a gate electrode coupled to the source electrode, and a drain electrode coupled to the gate electrode of the first transistor 514. In this example, the predetermined voltage (e.g., $V_{GND}$) is approximately 0V.

The capacitor 530 includes a first electrode that is coupled to the drain electrode of the second transistor 530 and the gate electrode of the first transistor 514. The capacitor 530 also includes a second electrode that is coupled to the output node 508.

The capacitor 530 has a capacitance in the picoFarad range and can be implemented, for example, by using a 1) FET with a gate electrode as a first terminal and the source electrode shorted to the drain electrode as the second terminal, and 2) an active area capacitor. In one embodiment, the capacitor 530 is implemented with an n-type transistor (e.g., an n-type field effect transistor (n-FET). The n-type transistor 534 includes a drain electrode and a source electrode both coupled to the output node 508. The n-type transistor 534 also includes a gate electrode coupled to the gate electrode of the first transistor 514 and the drain electrode of the second transistor 520.

Figure 6:
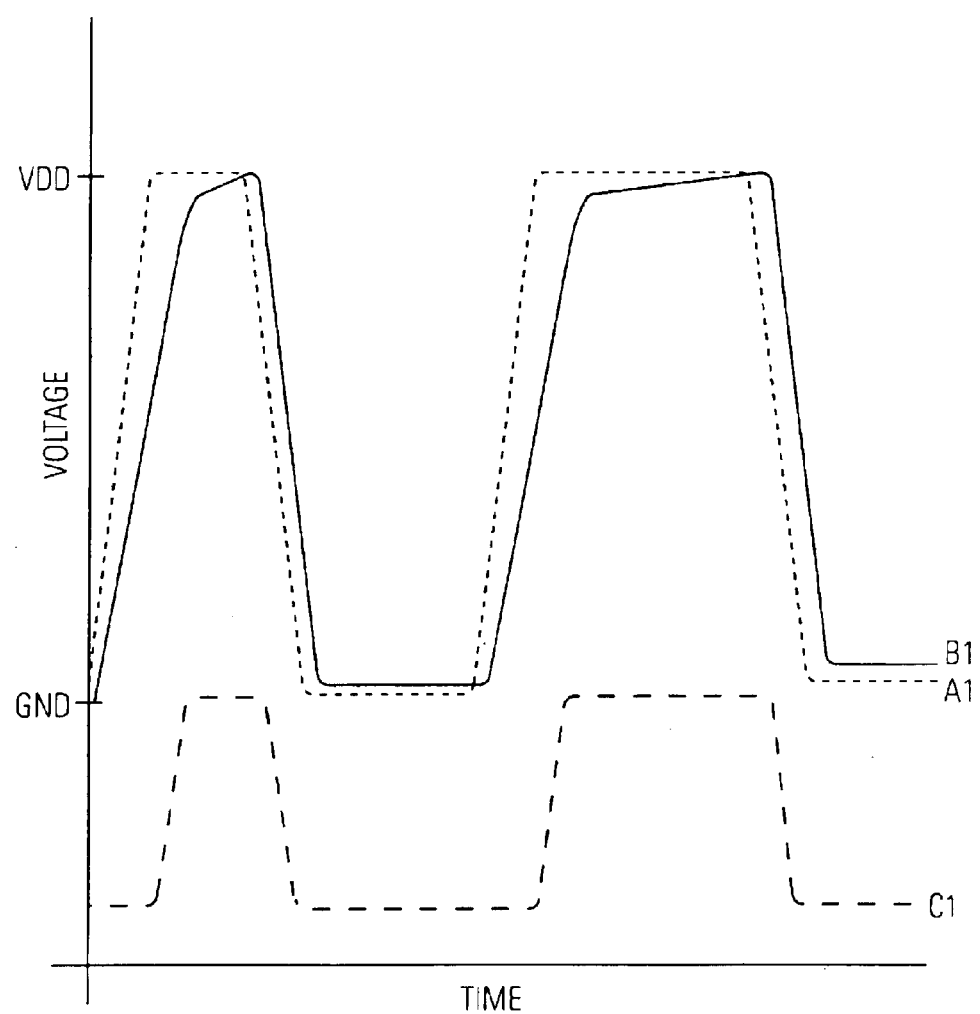
FIG. 6 illustrates the operation of the full logic level passive buffer of FIG. 5.

FIG. 6 illustrates the operation of the full logic level passive buffer 500 of FIG. 5. The nodes of interest are node a1, node b1, and node c1. The wave forms for node a1, node b1, and node c1 are denoted with the labels "a1", "b2", and "c3", respectively.

Referring to FIG. 6, the voltage at the c1 node is approximately one threshold voltage above below $V_{GND}$. Referring to FIG. 6, node "c1" is held at a low voltage by the transistor 520 connected to $V_{GND}$. The low voltage at the c1 node causes the input transistor 514 to pass the voltage value of node "a1" to node "b1".

When node "a1" is a logical zero, the N-FET immediately passes this value, and node "b1" becomes zero. But, if node "a1" is a logical one, "b1" charges, but does not immediately become a full logical one. Node "b1" is connected to node "c1" via a capacitor 530, so when node "b1" rises in voltage, node "c1" also rises in voltage because the voltage across a capacitor cannot change instantaneously. Boosting the voltage at node "c1" causes n-FET 514 to open enough to pass a full logical one from node "a2" to node "b2".

According to one embodiment of the invention, the passive buffer is implemented by a single type of FET transistors (e.g., by all n-type FETs or all p-type FETs). This implementation is referred to as a homogenous implementation. It is noted that the passive buffer in this implementation passes full logic levels.

Figure 7:
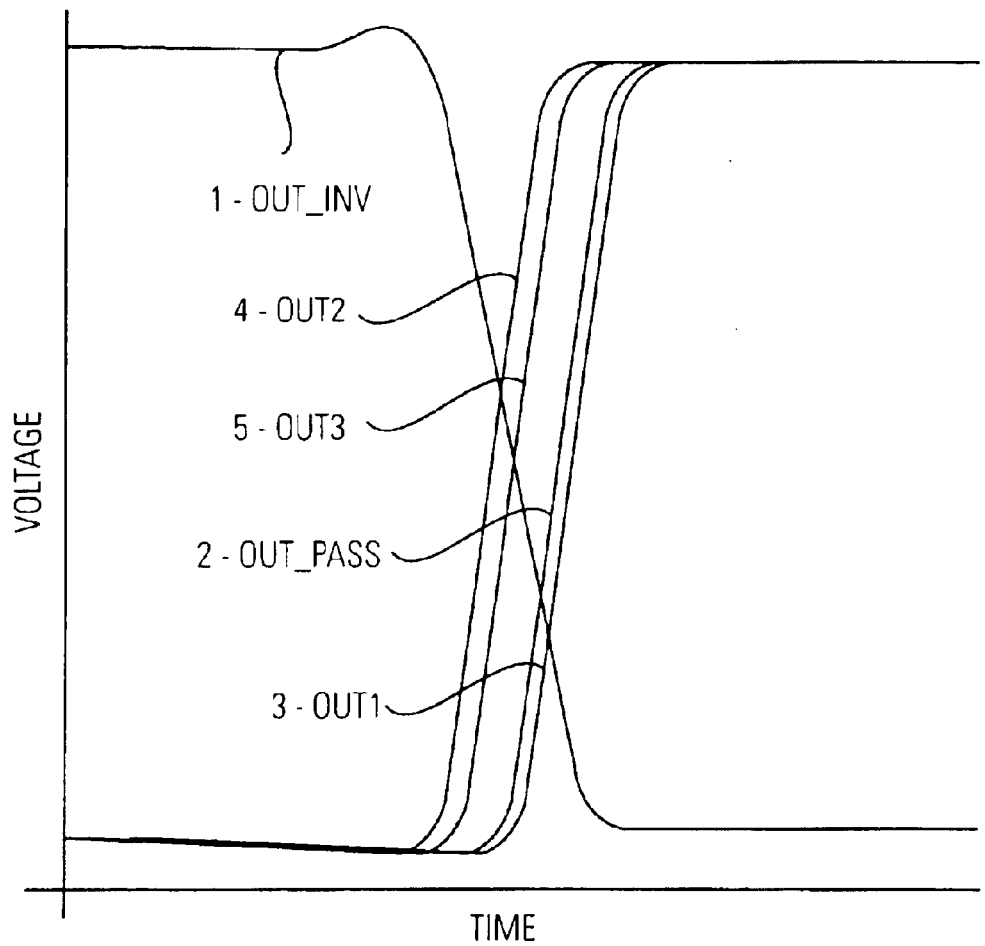
FIG. 7 compares the operation of the full logic level pass gate of FIG. 2, the full logic level passive buffer of FIG. 3, the full logic level passive buffer of FIG. 5, the prior art pass gate of FIG. 9, and the prior art inverted delay of FIG. 10.
Figure 9:
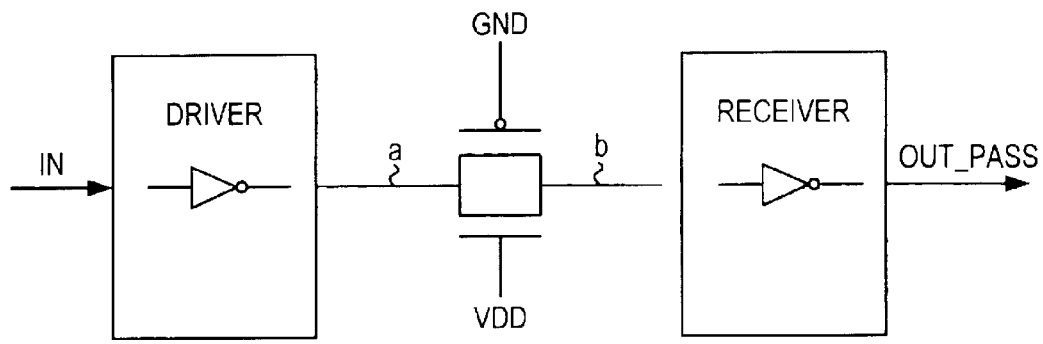
FIG. 9 illustrates a prior art pass gate implemented with an n-type FET and a p-type FET.
Figure 10:
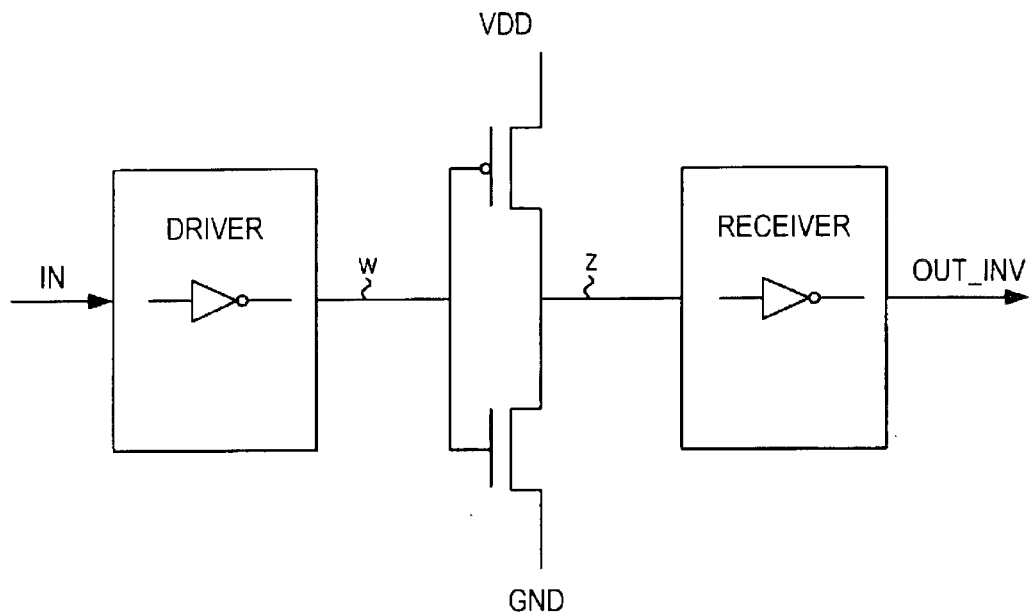
FIG. 10 illustrates a prior art inverted delay implemented with an n-type FET and a p-type FET.

FIG. 7 compares the operation of the full logic level pass gate of FIG. 1, the full logic level passive buffer of FIG. 3, the full logic level passive buffer of FIG. 5, the prior art pass gate of FIG. 9, and the prior art inverted delay of FIG. 10.

Figure 8:
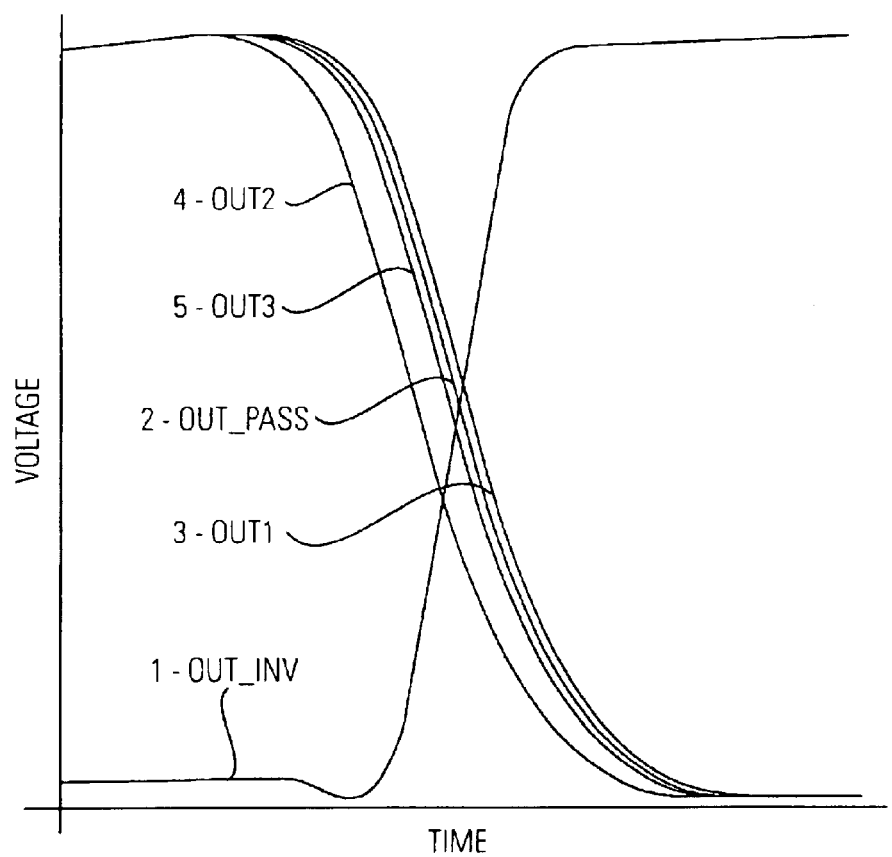
FIG. 8 compares the operation of the full logic level pass gate of FIG. 2, the full logic level passive buffer of FIG. 3, the full logic level passive buffer of FIG. 5, the prior art pass gate of FIG. 9, and the prior art inverted delay of FIG. 10.

FIG. 8 compares the operation of the full logic level pass gate of FIG. 1, the full logic level passive buffer of FIG. 3, the full logic level passive buffer of FIG. 5, the prior art pass gate of FIG. 9, and the prior art inverted delay of FIG. 10.

FIG. 7 and FIG. 8 compare the skew for a generic creation of a complement signal and according to the invention. An inverter is needed to create a complementary signal. The original signal is then delayed in some manner to better match the intrinsic delay of the inverter used to create the complementary signal.

When a traditional pass gate is employed to delay the original signal, the original signal and its complement have a non-centered crossing point (e.g., low voltage crossing point in FIG. 7 and high voltage crossing point in FIG. 8). In contrast, when a n/p-FET only pass gate according to the invention is employed to delay the original signal, the original signal and its complement have a more centered crossing point (see the "centered" crossing point in FIGS. 7 & 8) indicating that the skew is less than compared to the skew for the prior art approaches.

It is noted that the sizing of the transistors in the circuits described herein does not affect the general operation of the circuits according to the invention, but transistor sizing may affect the performance of the circuits. In one embodiment, the W/L of the transistors are as follows: 1) W/L=0.32/0.32 for the N-FETs, and 2) W/L=0.56/0.32 for the P-FETs.

Delay Element That Employs Charge Pump Structure

As described previously, N-FET full logic level passive buffers (delays) and P-FET full logic level passive buffers (delays) can be designed to incorporate the charge pump structure according to the invention. The advantages of a passive buffer that incorporates the charge pump structure include 1) a delay that is more closely matched that the delay of the prior art inverter and 2) a homogenous implementation that can lead to beneficial layouts.

Referring to FIGS. 7 and 8, it is noted that out2 is switching at about the same time as out_inv, especially with respect to out_pass, which is a prior art passive buffer approach. A more closely matched delay is important when a designer wants to create a complement with little skew between the signal and its complement.

Pass Gate Element That Employs Charge Pump Structure

As described previously, N-FET full logic level pass gates and P-FET full logic level pass gates can be designed to incorporate the charge pump structure according to the invention. The advantages of a pass gate that incorporates the charge pump structure includes 1) a homogenous implementation (i.e., the pass gate may be built from only n-FETs or p-FETs), which can lead to advantages in certain layout situations, and 2) a potential for faster operation than the prior art pass gate. For example, a faster operation may be achieved when the transistors are sized in such a manner that results in less loading of the signal as compared to the prior art pass gate structure. Referring to FIGS. 7 and 8, it is noted that the positive edge of out3 is faster than the positive edge of out_pass.

Another advantage of the circuit according to the invention is that a designer does not have to create a complement signal to control this pass structure.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A buffer comprising:
   a) an input node;
   b) an output node;
   a first transistor comprising a first transistor first node connected to said input node, a first transistor second node connected to said output node, and a first transistor control node;
   a second transistor comprising a second transistor first node connected to a first predetermined voltage node, a second transistor second node connected to said first transistor control node, and a second transistor control node connected to said first predetermined voltage node;
   a capacitive element connected between said second transistor first node and said output node; and
   a third transistor comprising a third transistor first node connected to said second transistor, second node, a third transistor second node connected to a second predetermined voltage node, and a third transistor control node connected to a third preselected voltage node.

2. The buffer of claim 1, wherein the capacitive element comprises a transistor comprising a drain node coupled to a source node and the said output node, and a gate node coupled to said first transistor control node.

3. The buffer of claim 1, wherein said first transistor, the said second transistor, and said third transistor are n-type field effect transistors.

4. The buffer of claim 1, wherein said first transistor, the said second transistor, and the said third transistor are p-type field effect transistors.

5. The buffer of claim 1 wherein the buffer is a full logic level passive buffer.

6. The buffer of claim 1, wherein said first predetermined voltage node is connectable to a $v_{DD}$ voltage.

7. The buffer of claim 1, wherein:

said first transistor first node is a drain, said first transistor second node is a source, and said first transistor control node is a gate:

said second transistor first node is a drain, said second transistor second node is a source, and said second transistor control node is a gate; and said third transistor first node is a drain, said third transistor second node is a source, and said third transistor control node is a gate.

8. The buffer of claim 1, wherein;

said first transistor first node is a source, said first transistor second node is a drain, and said first transistor control node is a gate;

said second transistor first node is a source, said second transistor second node is a drain, and said second transistor control node is a gate; and said third transistor first node is a source, said third transistor second node is a drain, and said third transistor control node is a gate.

9. The buffer of claim 1, wherein said second predetermined voltage node is connectable to a ground node.

* * * * *